(12) United States Patent
Sciascia et al.

(10) Patent No.: US 9,818,920 B2
(45) Date of Patent: Nov. 14, 2017

(54) LED SYSTEM

(71) Applicant: SAES GETTERS S.P.A., Lainate (MI) (IT)

(72) Inventors: Calogero Sciascia, Piacenza (IT); Alessio Corazza, Como (IT)

(73) Assignee: SAES GETTERS S.P.A., Lainate (MI) (IT)

( * ) Notice: Subject to any disclaimer, the term of this patent is extended or adjusted under 35 U.S.C. 154(b) by 0 days.

(21) Appl. No.: 15/529,022

(22) PCT Filed: May 10, 2016

(86) PCT No.: PCT/IB2016/052649
§ 371 (c)(1),
(2) Date: May 23, 2017

(87) PCT Pub. No.: WO2016/181293
PCT Pub. Date: Nov. 17, 2016

(65) Prior Publication Data
US 2017/0256688 A1 Sep. 7, 2017

(30) Foreign Application Priority Data
May 11, 2015 (IT) .............................. MI2015A0656

(51) Int. Cl.
| | | |
|---|---|---|
| H01L 33/56 | (2010.01) | |
| F21V 31/00 | (2006.01) | |
| F21V 3/04 | (2006.01) | |
| B01J 20/02 | (2006.01) | |
| B01J 20/04 | (2006.01) | |
| B01J 20/28 | (2006.01) | |

(52) U.S. Cl.
CPC .............. *H01L 33/56* (2013.01); *B01J 20/02* (2013.01); *B01J 20/041* (2013.01); *B01J 20/2803* (2013.01); *B01J 20/28004* (2013.01); *B01J 20/28007* (2013.01); *B01J 20/28016* (2013.01); *B01J 20/28059* (2013.01); *F21V 3/0409* (2013.01); *F21V 31/00* (2013.01)

(58) Field of Classification Search
CPC ......... H01L 33/56; B01J 20/02; B01J 20/041; B01J 20/28004; B01J 20/28007; B01J 20/28016; B01J 20/2803; B01J 20/28059; F21V 3/0409; F21V 31/00
See application file for complete search history.

(56) References Cited

U.S. PATENT DOCUMENTS

| | | | | |
|---|---|---|---|---|
| 4,362,626 A | * | 12/1982 | Takeuchi ................. | B01J 20/06 210/670 |
| 2005/0106088 A1 | * | 5/2005 | Kato ...................... | B01D 53/02 423/240 S |
| 2005/0250906 A1 | | 11/2005 | Husemann | |
| 2005/0258077 A1 | * | 11/2005 | Landau ..................... | B01J 20/02 208/244 |
| 2012/0000855 A1 | * | 1/2012 | Bazer-Bachi .......... | B01D 53/02 210/660 |
| 2013/0092969 A1 | | 4/2013 | Hikmet et al. | |
| 2014/0168526 A1 | * | 6/2014 | Ueyama ................ | G02F 1/1333 348/790 |

FOREIGN PATENT DOCUMENTS

| | | |
|---|---|---|
| EP | 1595930 A1 | 11/2005 |
| EP | 1851783 A | 11/2007 |
| EP | 2408942 A | 1/2012 |
| JP | 2011134785 A | 7/2011 |
| WO | 2006090423 A1 | 8/2006 |
| WO | 2010105945 A1 | 9/2010 |
| WO | 2012042428 A2 | 4/2012 |
| WO | 2012046175 A1 | 4/2012 |

OTHER PUBLICATIONS

PCT International Search Report and Written Opinion for PCT/IB2016/052649 filed on May 10, 2016 in the name of SAES GETTERS S.P.A. dated Jul. 22, 2016.
PCT International Preliminary Report on Patentability for PCT/IB2016/052649 filed on May 10, 2016 in the name of SAES GETTERS S.P.A. dated Apr. 6, 2017.

* cited by examiner

Primary Examiner — Mary Ellen Bowman
(74) Attorney, Agent, or Firm — Steinfl + Bruno LLP

(57) ABSTRACT

A non-hermetically sealed LED system containing an active composition having an amount between 0.06 and 2.5 mg per $cm^2$ of the system optical window area is described. The active composition contains an active material in powder form, wherein at least 75 wt % of the active material is chosen from one or more of active carbons, silver, copper, zinc, copper oxide, zinc oxide, calcium oxide, and silver oxide.

11 Claims, No Drawings

LED SYSTEM

CROSS REFERENCE TO RELATED APPLICATIONS

The present application is the U.S. national stage of International Patent Application PCT/IB2016/052649 filed internationally on May 10, 2016, which, in turn, claims priority to Italian Patent Application No. MI2015A000656 filed on May 11, 2015.

The present invention is inherent to LED systems containing active compositions. The purpose of the active composition is the removal of noxious substances such as sulfur or halogens (with particular reference to chlorine), sulfur-based and halogen-based volatile compounds.

It is known that a LED is an optoelectronic device that exploits the optical properties of some semiconductor materials to generate photons by means of electron-holes recombination. Electron and holes are injected into a recombination zone through two regions, one containing an n-type dopant for the electrons, the other one containing a p-type dopant for the holes, in order to achieve a so called p-n junction.

LED light emission is determined and defined by the semiconductor material and/or by one or more luminescent materials (phosphors), each emitting in a well-defined region of the visible spectrum, different colors being achieved by proper combinations of said luminescent materials. For example, white light can be obtained by combining a red LED, a green LED and a blue LED, or a single emitting blue/UV LED could be used to excite adjacent phosphors re-emitting light at longer wavelengths, in such a way that a single LED with phosphors can have and exhibit a proper color spectrum, such as yellow or yellow and red that combined with the blue emission from the LED gives white light.

Essentially a LED consists in a thin sheet of semiconductor material (often called and referred to as "die") over which the phosphors are distributed, the thin sheet being connected to an appropriate structure for the power supply and the thermal dissipation. The die is then protected by a polymeric encapsulant, and this system is commonly known as LED package.

For the purposes of the present invention the term LED system encompasses both simple LED packages mounted over traditional substrates and encapsulated with standard silicone or epoxy resins, and also illumination devices made up of LED packages and additional components, such as heat sinks, reflectors, diffusers, bulbs or external envelopes.

LED systems exhibit enhanced luminous emissions and a longer operational life with respect to traditional light sources, but could suffer a performance decay and manifest reliability problems due to the presence of sulfur or halogens, such as chlorine, that can penetrate from the outside environment (e.g. sulfur from corrugated paperboards or organic rubber packages) or they can be released from LED materials such as soldering pastes, Printed Circuit Boards (PCBs) and gasket materials. More specifically the high operating temperature of a LED system can lead to the release of significant amounts of chlorine that together with sulfur can diffuse in the whole system reacting with the reflecting silver-coated surfaces, blackening them, or reacting with silver contacts leading to the formation of $Ag_2S$ and AgCl, changing their optical and/or electrical properties.

To overcome these problems, LED manufacturers try to avoid to the maximum extent the use of sulfur and/or halogen releasing materials, but this leads to constrains in the LED systems design and manufacturing that can be quite expensive to produce, for example by employing particular types of PCBs. Moreover it is not possible to completely avoid penetration and release of these substances over the operating lifetime of the LED, which therefore will encounter a progressive decay, even before its actual use, while kept in stock on a shelf.

As already outlined, one of the main degradation causes for the LED system is related to the penetration of sulfur or halogens, with particular reference to chlorine, and their compounds that are present in the atmosphere and that even at low concentrations can induce the above mentioned optical and electrical properties decay. In particular in some polluted areas the level of S-compounds or Cl-compounds in air can be significantly higher than the average values (e.g. in some areas close to highways or in tunnels the $H_2S$ concentration can be higher than 10 ppb) and diffusion through the not-hermetically sealed LED system can lead to accelerated degradation issues. Hydrogen sulfide ($H_2S$) results to be one of the most deleterious contaminants that can affect performances of the LED system, therefore hereafter the description of the invention is mainly referring to the contaminant $H_2S$, but of course it concerns also all the effects related to other S-compounds or halogens-compounds.

Aim of the present invention is to provide a LED system capable to overcome these problems and in a first aspect thereof it consists in a LED system having an optical window and an internal volume non-hermetically sealed, meaning that the $H_2S$ ingress in said internal volume is comprised between $5.5*10^{-4}$ and $1.9*10^{-1}$ micrograms/day when the $H_2S$ external volume concentration is 10 ppb, and containing in said internal volume an active composition whose amount is comprised between 0.06 and 2.5 mg per $cm^2$ of the system optical window area, said active composition containing an active material in powder form, wherein at least 75 wt % of said active material is chosen from one or more of active carbons, silver, copper, zinc, copper oxide, zinc oxide, calcium oxide, silver oxide.

Preferably the average size of the active material powder or powders (in case a mix of active materials is used), is comprised between 0.1 and 20 µm. For non-spherical powders the size refers to the biggest particle dimension.

Preferably said active composition amount per $cm^2$ of the optical window area is comprised between 0.1 and 1 mg.

LED systems for outdoor applications can be hermetically sealed, opened, or not hermetically sealed.

A hermetically sealed system may encounter problems of water vapor condensation on optical components within the LED system: in spite of the system sealing, it is known that the moisture can slowly permeate through the system parts and thus issues related to $H_2O$ accumulation and optical opacification may occur; therefore hermetically sealed systems have to take into account the moisture permeation and need a specific design, increasing complexity and costs, to avoid the condensing of water vapor.

Open systems aim at easy LED thermal management by means of the exchange of air with the external environment, such as in recent developments by CREE industries on the so called 4Flow Filament cooling convection technology; the level of gas exchanges also minimizes residence time within the lamp of noxious species, but those may nevertheless affect LED operations.

Finally we have non-hermetic systems, i.e. closed system having nevertheless a limited gaseous exchange with the external environment; in the prior art, such as in US patent application 2013/092969 the gas exchange is seen as a compromise with respect to the hurdles of providing a hermetic seat, and the getter is described as a means for taking care of moisture and/or oxygen associated to the limited gas exchange with the external environment due to the non-hermetic sealing.

The inventors have determined the correct balance between permeation in non-hermetically sealed systems with a controlled gas penetration range and the active composition amount for sulfur/halogen noxious compounds removal, allowing for a gas exchange with the external environment that assures the evaporation and migration of water vapor to the external environment and maximum efficiency of the active compounds. Gas exchange is favored by the heating during normal LED system operation, even though it is not enough to produce any advantage on the thermal management side as gas exchange is much lower than in an open system configuration.

The present invention is therefore an improvement with respect to what disclosed in US patent application 2014/168526, describing a much wider range for the active composition amount to be usefully inserted in a LED system.

The gas exchange avoids also the condensation of volatile organic compounds (VOCs), that may be outgassed by the system components, and thus the subsequent opacification.

The inventors have determined the correct balance for taking into account at the same time the moisture condensation problem and the presence of sulfur-containing contaminants (i.e. $H_2S$ and more generically sulfur volatile compounds), as the LED system according to the present invention falls in the non-hermetic seal type of devices, i.e. devices that allow for a limited gas exchange with the external environment, and is capable to avoid the detrimental effects related to the above contaminants, while assuring a proper moisture exchange and overcoming water vapor condensation issues.

Therefore the LED system according to the present invention does not necessarily need the presence of a moisture getter. This solution is therefore different from what disclosed in US patent application 2013/092969, focused on sealed LED devices with very low oxygen and moisture permeation, describing an oxygen and/or moisture getter to cure the defects of a non-perfect hermetic sealing. In particular the system according to the present invention is designed in such a way to have a limited but meaningful gas exchange, assuring a sufficient flow-in and flow-out of the water vapor, and differently from US patent application 2013/092969 such gas exchange (including therefore moisture exchange as desired effect and not a detrimental phenomenon) is needed for the correct operation of the system. With the level of non-hermeticity according to the present invention, the presence of a generic moisture getter would act as concentrator, leading to a massive gas release during LET) switching on, and a consequent light emission degradation due to fogging. In fact a generic moisture/oxygen getter will reach an equilibrium pressure with the environment, but as effect of LED operation and consequent heating, the increase in temperature will induce a new higher equilibrium pressure, with inherent gas release. For example at 70° C. it should be sufficient the release from the getter of a small amount of water corresponding to about 0.2 mg per each $cm^3$ of the inner system free volume to generate a saturated water vapor and to start the water condensation.

It is important to underline that the ingress of $H_2S$ into the internal volume of the LED system will scale with the outside $H_2S$ concentration, for example in case of accelerated tests the external environment could be conditioned at 10 ppm, i.e. a concentration 1000 times higher with respect to the reference one given, and therefore the permeated amount of $H_2S$ will increase accordingly to the range between $5.5*10^{-1}$ and $1.9*10^2$ micrograms/day. This level of interaction between the inner atmosphere of a LED system and the external environment can be achieved by various means, such as the use of an external permeable container or permeable walls, or by a container almost impermeable but having some small opening/pinholes or using permeable gaskets, such as silicone based gaskets.

The main advantage of a LED system according to the present invention is to assure the effective removal of gaseous noxious species that could penetrate and affect its performances, preventing lighting performance decay resulting from color changes and degradation of reflective surfaces and from alteration of the electrical characteristics of silver contacts, if/when present.

Another relevant advantage of a LED system according to the present invention is given by the freedom to choose the adopted materials, without the need to take into account the possible generation of sulfur and halogens (mainly but non only chlorine), so that the system is more reliable, easier and at the same time less expensive to manufacture.

The active material contained in an active composition present in a LED system according to the present invention is preferably used in the form of powders having a high specific surface, higher than 70 $m^2/g$.

Moreover the inventors have found that the use of active carbons, silver, copper, zinc, copper oxide, zinc oxide, calcium oxide, silver oxide, as main constituents of an active material contained in an active composition, within LED systems, not only ensures sulfur and halogens removal from room temperature up to 100° C., but they will not release such contaminants even at 130° C., that is the maximum LED operating temperature.

This is an additional property with respect to a sulfur sorbent such as the commonly and widely used silica-gel, that assures good sorption ability just at lower temperatures and has a reversible release already below 100° C., as evidenced in the 1993 book by the University of Tokyo, authored by M. Suzuki, "Fundamentals of adsorption" at page 294. Furthermore, it was found that the addition of lesser amounts of cerium oxide, iron oxide, manganese oxide, palladium oxide, tin oxide or a combination thereof to the main active materials, with a cumulative percentage between 1 wt % and 25 wt % of the total active material amount, improves the removal action towards the described contaminants.

The active materials are usually placed within the LED system at a distance equal to or less than 2 cm from the die or from the dies array, this ensures and maximizes the protective action towards the more sensitive components of the LED system, i.e. silver reflective coatings and silver contacts (these latter if/when present).

A suitable configuration for active materials in the form of powders as such is within containers. Examples of such configurations are widely known to a person skilled in the art, and can be found for example in the European patents 1851783 and 2408942 both in the applicant's name, and whose teachings are herein incorporated by reference.

Alternatively, the active composition can be used in the form of compressed powders. In this case preferred shapes are pills and tablets, and also in this case additional details may be found in European patent 2408942.

Another preferred configuration for the active composition, also in this case preferably directly placed as such close to the LED die (or the LED dies array), is in the form of powders, preferably high specific surface powders (≥70 $m^2/g$) dispersed in a suitable polymeric matrix. Preferred matrices are chosen from silicone-based resins or silicone-epoxy- or silicone-acrylic-based resins. Alternatively the active composition can be applied on a suitable support or strip, preferably a metallic strip. In a preferred embodiment the active composition is dispersed in a polymeric matrix, for example and preferably in a silicone-based resin, deposited and adhering on the support, as described in the European Patent 1595930 in the applicant's name.

In another preferred configuration the active material is in the form of high specific surface active powders dispersed in the encapsulating polymeric resin placed over the die, with powders dimension and concentration chosen in such a way that the resin transparency is not significantly altered. For example, the high specific surface active powders could be dispersed in the resin with a concentration comprised between 0.1 wt % and 12 wt %, preferably between 1.5 wt % and 8 wt %. In this specific embodiment the preferred resin is silicone.

Generally speaking the present invention encompasses the fact that the powders are used as such, but can be also advantageously used suitably dispersed and bound, by means of a suitable chemical agent (binder) by means of a suitable consolidation treatment, for example a thermal treatment such as sintering.

The invention will be further illustrated with the help of the following non limiting examples.

EXAMPLE 1A: SAMPLE PREPARATION

Several samples are prepared applying a silver layer or a silver coating on stainless steel substrates, each substrate having a surface of 12.5 $cm^2$. The average thickness of the applied silver layer or coating is 5 μm and the coverage is unitary. Measured reported values are averaged on several sample points. The weight of deposited silver is calculated as weight difference between the substrate before and after deposition and consolidation, corrected for the residue of the matrix.

Comparative sample C1 consists of a silver foil glued on a substrate of stainless steel; the specific load of silver on the sample is 5.2 $mg/cm^2$, it represents the solution described in the above referenced US patent application 2014/168526, as such amount correspond to a silver layer with a 10 micron thickness, over half of the substrate surface.

Other samples are prepared using a silver paste, consisting of a combination of small Ag particles, adhesive agent and dispersant, deposited by doctor blading with thickness of about 5 μm and consolidated in air at 250° C. for 90 minutes; by varying the relative amounts of these components different samples with final average specific load of silver are made, more specifically, comparative sample C2 with 2.9 $mg/cm^2$ and sample S1 with 2.0 $mg/cm^2$.

Further samples are prepared with lower silver content, by depositing by doctor blading and consolidating in air at 250° C. for 90 minutes a paste of silver powder mixed with a gas permeable silicone-based resin and a volatile solvent; by varying the relative amounts of these components, different samples with final average specific load of silver are made, more specifically, sample S2 with 0.8 $mg/cm^2$, sample S3 with 0.5 $mg/cm^2$, sample S4 with 0.08 $mg/cm^2$ and finally sample C3 with 0,005 $mg/cm^2$.

EXAMPLE 1B: SAMPLE CHARACTERIZATION

The prepared samples have been evaluated in terms of relative performance, concerning sorption capacity for sulfur, as Function of the specific Ag load. Sulfur is delivered in a chamber of about 1 liter containing all the samples by means of a flux of $H_2S$, at the concentration of 4 ppm in a nitrogen carrier with a 220 cc/min flow. All samples have been exposed under the same conditions for the same time of 15 hours.

The obtained results are shown in table 1, reporting the sample ID, the average silver load, and the relative amount of S atoms with respect to Ag ones measured on the samples by a calibrated Energy-Dispersive X-ray (EDX) probe, indicating therefore the different samples efficiencies.

TABLE 1

| Sample ID | Average Ag load ($mg/cm^2$) | S atoms/Ag atoms (%) |
|---|---|---|
| C1 | 5.2 | 0.1 |
| C2 | 2.9 | 0.8 |
| S1 | 2.0 | 1.2 |
| S2 | 0.8 | 9.4 |
| S3 | 0.5 | 2.2 |
| S4 | 0.08 | 1.1 |
| C3 | 0.005 | <0.1 |

It is possible to observe that only with the samples according to the present invention there is an efficiency higher than 1%, being for the best sample (S2) almost two orders of magnitude higher than the one achieved with sample C1, made according to US patent application 2014/168526. The lower limit is identified in terms of efficiency: the 1% S/Ag atom ratio is considered as a suitable value to assure that the adopted solution, also in view of the specified constraint on the optical window area, not only is capable to remove a certain amount of S, but also with an acceptable kinetic, as evidenced by the S load achieved and measured after the experiment duration of 15 hours.

EXAMPLE 2A: SAMPLE PREPARATION

This example makes a comparison among two embodiments according to the present invention; in particular sample S5 is prepared with the same method as S2 but with a paste containing, instead of the Ag powder, a powder mixture of calcium oxide (90% wt) and iron oxide (10% wt), Sample S5 has an active composition load of 0.3 $mg/cm^2$ and a coating thickness of 5 μm.

EXAMPLE 2B: SAMPLE CHARACTERIZATION

Similarly to example 1b, the prepared samples have been evaluated in terms of relative performance, concerning sorption capacity for sulfur expressed as relative amount of S atoms with respect to atoms of the active composition (Ag atoms for S2, Ca+Fe atoms for S5). Results are reported in table 2.

TABLE 2

| Sample ID | Average active composition load ($mg/cm^2$) | S atoms/active atom (%) |
|---|---|---|
| S2 | 0.8 | 9.4 |
| S5 | 0.3 | 14 |

As shown in table 2, both samples S2 and S5 have capabilities well above the 1% (S atoms)/(active composition atoms) ratio; even though S5 has a lower active composition load, such sample is even capable to achieve a higher efficiency, so this specific solution (calcium oxide and iron oxide combination) is a preferred embodiment according to the present invention.

The invention claimed is:

1. An LED system having
an optical window and
an internal volume non-hermetically sealed
wherein
$H_2S$ ingress in said internal volume is comprised between $5.5*10^{-4}$ and $1.9*10^{-1}$ micrograms/day when $H_2S$ external volume concentration is 10 ppb, and
containing in said internal volume an active composition having an amount comprised between 0.06 and 2.5 mg per $cm^2$ of system optical window area,
said active composition containing an active material in powder form, wherein at least 75 wt % of said active material is chosen from one or more of active carbons, silver, copper, zinc, copper oxide, zinc oxide, calcium oxide, silver oxide.

2. The LED system according to claim 1, wherein said active material powders have an average size comprised between 0.1 and 20 μm.

3. The LED system according to claim 1, wherein said active composition contains at least an additional active material chosen from cerium oxide, palladium oxide, tin oxide, iron oxide, manganese oxide, in an amount comprised between 1 and 25 wt %.

4. The LED system according to claim 1, wherein said active composition amount per $cm^2$ of the optical window area is comprised between 0.1 and 1 mg.

5. The LED system according to claim 1, wherein said active materials are in the form of powders with a specific surface $\geq 70$ $m^2/g$.

6. The LED system according to claim 1, wherein said active material powders are retained in a suitable container.

7. The LED system according to claim 1, wherein said active material powders are compressed in the form of stand-alone pills or tablets.

8. The LED system according to claim 1, wherein said active material powders are dispersed in a polymeric matrix, said matrix being preferably based on a silicone- or silicone-epoxy- or silicone-acrylic-based resin.

9. The LED system according to claim 8, wherein said polymeric matrix containing the active material powders is deposited on a supporting strip, preferably a metallic strip.

10. The LED system according to claim 8, wherein said active material powders concentration in the active composition is comprised between 0.1 wt % and 12 wt %, preferably between 1.5 wt % and 8 wt %.

11. The LED system according to claim 10, wherein said active composition is placed over a LED die for its encapsulation.

* * * * *